United States Patent [19]

Kwon

[11] Patent Number: 5,696,382

[45] Date of Patent: Dec. 9, 1997

[54] ION-IMPLANTER HAVING VARIABLE ION BEAM ANGLE CONTROL

[75] Inventor: Chang-Heon Kwon, Seongnam, Rep. of Korea

[73] Assignee: Hyundai Electronics Industries Co., Ltd., Ich'on, Rep. of Korea

[21] Appl. No.: 774,843

[22] Filed: Dec. 27, 1996

[30] Foreign Application Priority Data

Dec. 30, 1995 [KR] Rep. of Korea ............. 95-69589

[51] Int. Cl.$^6$ .................................................. H01J 37/14
[52] U.S. Cl. ................................. 250/492.21; 250/398
[58] Field of Search ............................. 250/492.21, 492.2, 250/398, 396 R, 396 ML

[56] References Cited

U.S. PATENT DOCUMENTS

| | | | |
|---|---|---|---|
| 4,490,901 | 1/1985 | Clark et al. | 29/574 |
| 4,595,837 | 6/1986 | Wu et al. | 250/492.21 |
| 4,633,138 | 12/1986 | Tokiguchi et al. | 315/111.81 |
| 4,634,931 | 1/1987 | Taya et al. | 315/111.81 |
| 4,680,474 | 7/1987 | Turner et al. | 250/492.21 |
| 4,804,852 | 2/1989 | Rose et al. | 250/492.1 |
| 4,980,562 | 12/1990 | Berrian et al. | 250/492.2 |
| 5,132,544 | 7/1992 | Glavish | 250/492.2 |
| 5,134,299 | 7/1992 | Denholm | 250/492.2 |
| 5,350,926 | 9/1994 | White et al. | 250/492.21 |
| 5,432,106 | 7/1995 | Hong | 437/35 |
| 5,497,006 | 3/1996 | Sferlazzo et al. | 250/427 |
| 5,510,146 | 4/1996 | Miyasaka | 427/255 |

*Primary Examiner*—Kiet T. Nguyen
*Attorney, Agent, or Firm*—Ware, Fressola, Van Der Sluys & Adolphson LLP

[57] ABSTRACT

An ion-implanter, having variable ion-beam angle control, that includes: an ion source for decomposing a gas into a plasma gas; a magnetic analyzer for analyzing only desired ions; an accelerating tube for accelerating the analyzed ions with an energy required to implant them; a scanner for scanning the accelerated ions on the whole surface of a wafer; a Faraday box provided between the scanner and the wafer and connected to an ammeter for measuring the amount of the implanted ions; and an ion-beam angle regulator for regulating the angle of an ion beam which passes the Faraday box. The ion-beam angle regulator includes: a magnet provided at the end of the Faraday box and applying a magnetic field to the ion beam that passes through the magnetic field so as to change the projecting angle of the ion beam; a data input for entering a required normal angle of the ion beam; a controller for setting process conditions on the basis of a signal received from the data input; and a driver for combining the signal of the controller and a voltage feedback signal of the accelerating tube so as to fix the magnitude of the magnetic field of the magnet to a level required in the process.

3 Claims, 4 Drawing Sheets

ION-IMPLANTER HAVING VARIABLE ION BEAM ANGLE CONTROL

BACKGROUND OF THE INVENTION

1. Field of the Invention

The present invention relates to an ion-implantor and more particularly to an ion beam ion implanter, having variable ion-beam angle control, which is applicable to a process that includes various sequences for an ion-implantation such as a Lightly Doped Drain (hereinafter, referred to as an "LDD").

2. Discussion of Related Art

Ion-implantation in the fabrication of a semiconductor refers to a process for implanting impurity ions such as Boron (B), Phosphorous (P) and Arsenic (As) into a wafer in an ion beam form by using high voltage in vacuum. The equipment for this process is an ion-implanter.

The ion-implanter comprises an ion source which is the source of an ion beam, a beam line section, and an end station having a target wafer, as shown in FIGS. 1 and 2. In the ion-implanter, gas particles released from a gas box are injected into the ion source 1 and converted into univalent or divalent ions in a plasma state by a filament in the ion source 1. The ions are then carried towards a magnetic analyzer 2 by potential difference, and the magnetic analyzer 2 sets the ion beam at 90 degrees so as to separate out only desired ions by a centrifugation according to ion weight difference and transfer them to an accelerating tube 3. The ions are accelerated in the accelerating tube 3 with a required energy, scanned in a scanner 4 and finally projected to a wafer 6 via a Faraday box 5. The Faraday box 5 is connected to an ammeter 7 therein for measuring the amount of the ions injected into the wafer.

A typical process which employs the general ion-implanter constructed as above is an LDD process. As shown in FIG. 3A, the first step of the LDD process is implanting N⁻ ions in an ion source/drain region formed on each side of a gate 12 so as to prevent a short channel caused by a hot carrier that is generated from a strong electric field at the edge of the voltage-applied gate.

The next step, as shown in 3B, is the formation of a spacer 13 on each side wall of the gate 12 by depositing an oxide layer through an oxidation and subsequently carrying out an anisotropic etching on the oxide layer. This step is to prevent a hot carrier after forming a MOS gate, by leaving the implanted N⁻ ions on the edge of the gate just prior to ion-implantation.

Finally, N⁻ ions are implanted in the ion source/drain region on each side of the gate 12 so as to decrease the specific resistance of the region, as shown in 3C.

In the LDD process employing the general ion-implanter as described above, there are disadvantages such as the increase in the number of processes or the deterioration of the gate, and the detailed problems thereof are given as follows.

The general ion-implanter implants ions always in a rectilinear direction from the front side of the wafer. In particular, the LDD process includes a first ion-implantation of a small amount of ions and a second ion-implantation of a large amount of ions beneath the both ends of the gate electrode, so that it is necessary to carry out an intermediate process for forming a spacer is essential as shown in FIG. 3B. In other words, there are some given problems in that it is required to properly regulate the conditions of a spacer etching process as well as a deposition so as to form the gate to be provided with the spacer, and therefore such a requisition results in the increase in a processing cycle time. In particular, the attendant etching process for forming the spacer presents a deterioration in the quality of the gate.

SUMMARY OF THE INVENTION

Accordingly, the present invention is directed to an ion-implanter, having variable ion-beam angle control, that substantially obviates one or more of the problems due to limitations and disadvantages of the conventional art.

An object of the present invention is to provide an ion-implanter, having variable ion-beam angle control, which is constructed to perform a heavy doping process immediately after a light doping process without any intermediate process for forming a spacer, by optionally changing the angle of an ion beam at any time in the course of the ion-implantation.

Additional features and advantages of the invention will be set forth in the description which follows, and in part will be apparent from the description, or may be learned by practice of the invention. The objectives and other advantages of the invention will be realized and attained by the structure particularly pointed out in the following description, appended claims as well as the attached drawings.

To achieve these and other advantages and in accordance with the purpose of the present invention, as embodied and broadly described, the ion-implanter having variable ion-beam angle control includes: an ion source for decomposing a gas introduced from an external gas box into a plasma gas; a magnetic analyzer for analyzing only desired ions among all the atoms of the decomposed plasma; an accelerating tube for accelerating the analyzed ions with an energy required to implant them; a scanner for scanning the accelerated ions on the whole surface of a wafer so as to uniformly implant them; a Faraday box provided between the scanner and the wafer and connected to an ammeter for measuring the amount of the implanted ions; and an ion-beam angle regulator for regulating the angle of an ion beam which passes the Faraday box, wherein the ion-beam angle regulator comprises: a magnet being provided at the end of the Faraday box and applying a magnetic field to the ion beam passing therethrough so as to change the projecting angle of the ion beam; a data input for entering a required normal angle of the ion beam; a controller for setting process conditions on the basis of a signal received from the data input; and a driver for combining the signal of the controller and a voltage feedback signal of the accelerating tube so as to fix the magnitude of the magnetic field of the magnet to a level required in the process. Furthermore, the magnet is either an electromagnet whose polarity is reversible or a rotating electromagnet capable of generating a rotational magnetic field.

According to the present invention, the ion-implanter is constructed to able to change the angle of the ion beam so as to implant a small amount of ions beneath the lower edge on each side of a gate electrode, and then immediately regulate the angle at 90 degrees so as to implant a large amount of ions. Accordingly, an intermediate process for forming a spacer as required in the prior art may be omitted. Therefore, because several processes for forming the spacer such as a space deposition, a masking and a space etching can be omitted during the LDD process, it is apparent that the present invention provides the reduction of the processing cycle and materials needed, and improves the electrical properties of the device

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 4:
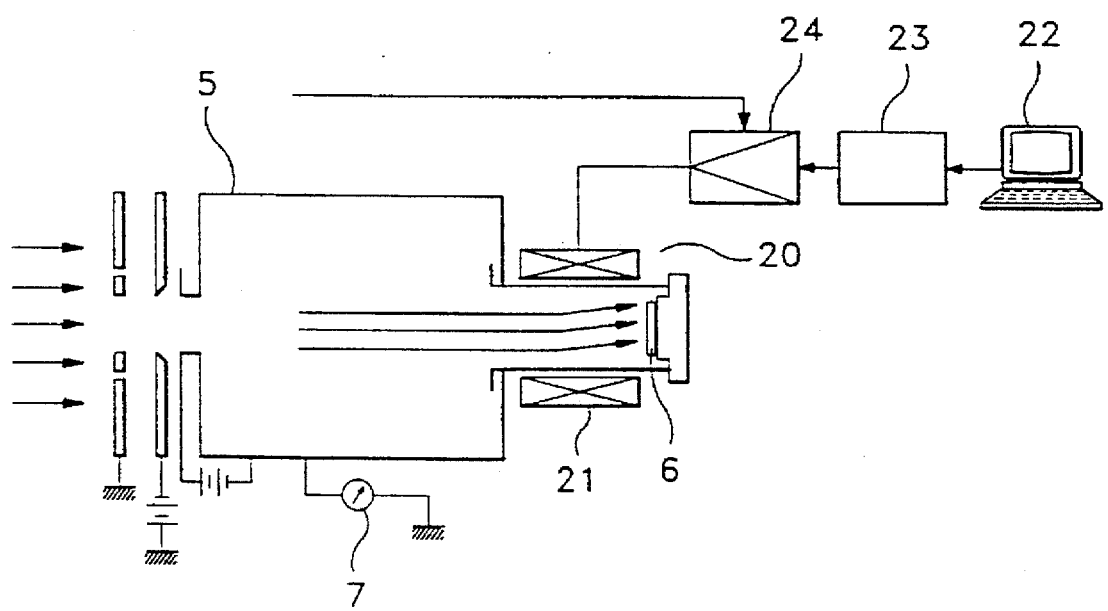
FIG. 4 is a detailed view showing the construction of an ion-implanter according to the present invention.
Figure 5A:
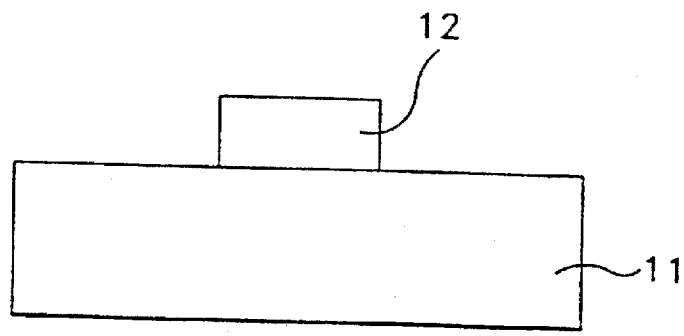
FIGS. 5A to 5C illustrate an LDD process employing the ion-implanter according to the present invention.
Figure 5B:
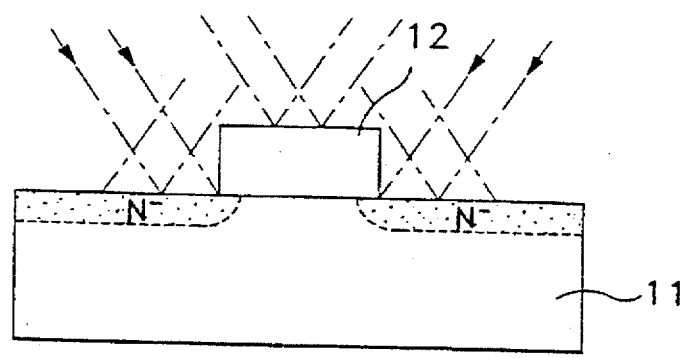
Figure 5C:
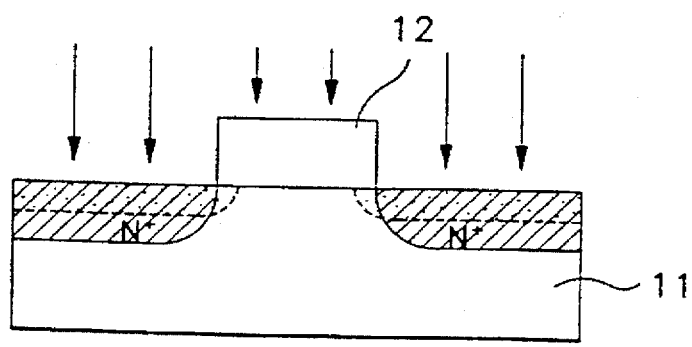

FIG. 4 is a detailed view showing the construction of an ion-implanter, having variable ion beam angle control, according to the present invention and FIGS. 5A to 5C illustrate an LDD process employing the present invention.

Figure 1:
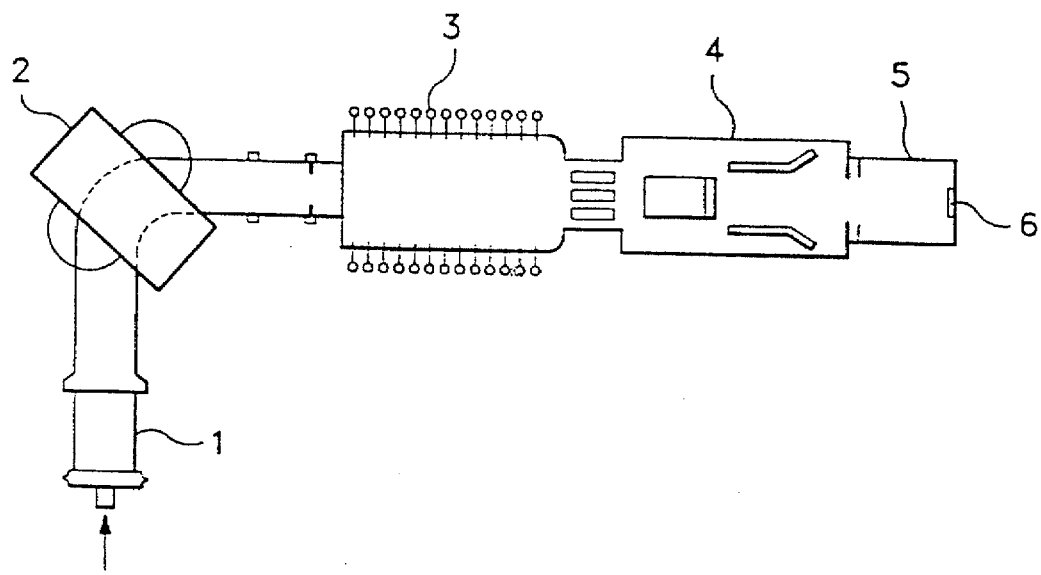
FIG. 1 is a view showing the construction of a conventional ion-implanter.
Figure 2:
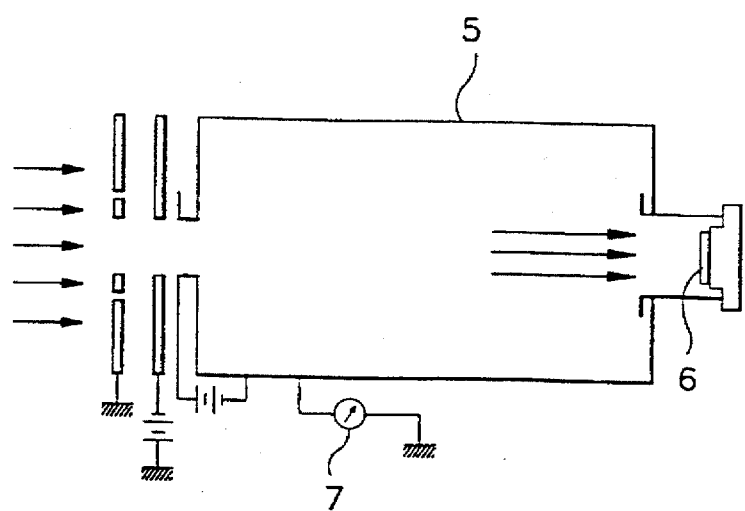
FIG. 2 is a detailed view of the Faraday box taken in the ion-implanter of FIG. 1.
Figure 3A:
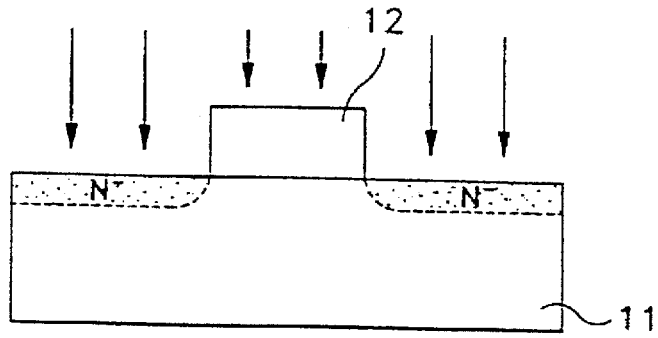
FIGS. 3A to 3C illustrate an LDD process employing the conventional ion-implanter.
Figure 3B:
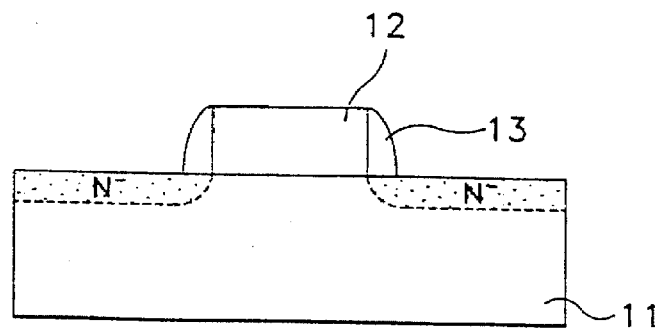
Figure 3C:
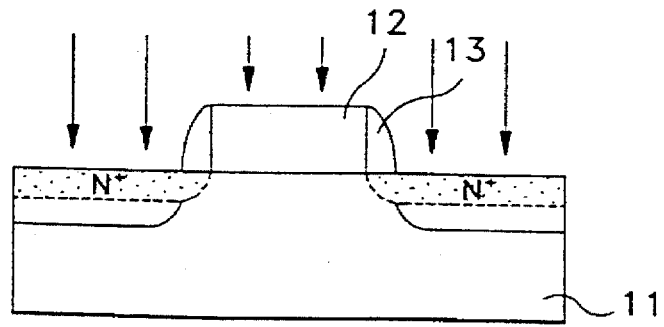

The following description refers to the general ion-implanter of FIG. 1 because the drawings illustrate only important components of the present invention and the other components are equal to those of the general ion-implanter.

Referring to FIGS. 1 and 4, the ion-implanter of the present invention which is constructed as the general ion-implanter, comprises an ion source 1 for decomposing a gas introduced from an external gas box into a plasma gas, a magnetic analyzer 2 for analyzing only desired ions among all the atoms of the decomposed plasma, an accelerating tube 3 for accelerating the analyzed ions with an energy required to implant them, a scanner 4 for scanning the accelerated ions on the whole surface of a wafer 6 so as to uniformly implant them, and a Faraday box 5 provided between the scanner 4 and the wafer 6 and connected to an ammeter 7 for measuring the amount of the implanted ions. The present invention further comprises an ion-beam angle regulator 20 for regulating the angle of an ion beam which passes the Faraday box 5. While the conventional ion-implanter implants ions always in a rectilinear direction from the front side of the wafer and requires a process for forming a spacer between the light and heavy doping processes, the present invention enables the heavy doping process to be performed immediately after the light doping process without any intermediate process for forming a space.

In addition, the ion-beam angle regulator 20 includes a magnet 21 provided at the end of the Faraday box 5 and applying a magnetic field to the ion beam that passes through the magnetic field for changing the projecting angle of the ion beam; a data input 22 for entering a required normal angle of the ion beam; a controller 23 for setting process conditions on the basis of a signal received from the data input 22; and a driver 24 for combining the signal of the controller 23 and a voltage feedback signal of the accelerating tube 3 (refer to FIG. 1) so as to fix the magnitude of the magnetic field of the magnet 21 to a level required in the process. Further, the magnet includes an electromagnet whose polarity is reversible, or a rotating electromagnet capable of generating a rotational magnetic field. The rotating electromagnet refers to a magnet applied with a current of sine wave so as to form a rotational magnetic field and therefore solidly change the angle of the ion beam. For that reason, the present invention employing a rotating electromagnet such as the magnet 21 makes it possible to perform an effective process for implanting ions into a trench-shaped well-side well.

As shown in FIG. 5A, the gate electrode 12 is formed on a silicon substrate 11. The gate electrode 12 is formed having the same width as the gate electrode and spacers of the conventional art. As will be explained in the following, spacers are not required in the present invention and therefore, are omitted.

In succession, a light doping of N⁻ ions is carried out on an ion source/drain region provided on each side of the gate electrode 12 by regulating the angle of the ion beam projected on the wafer as the same sequences of the prior art. For example, as shown in 5B, the ion beam may be implanted to a right LDD by adjusting the angle of the beam at 45 degrees, and to a left LDD by adjusting it at 45 degrees in the other direction. As evident from the drawing, this process is to implant the ions just beneath the edge of the gate electrode 12 by projecting the ion beam in a slanting direction towards the ion source/drain region.

After the completion of the light doping process, the heavy doping process is performed by projecting the ion beam in a vertical direction towards the gate electrode 12. To prevent a hot carrier which is inevitable in the LDD process according to the prior art, a space forming process has to be attended after the light doping process so as to form the space on each side of the gate electrode and then the heavy process is performed on the ion source/drain region rather than a portion blocked by the formed spacers, because the ions are implanted in a rectilinear direction to the wafer.

Moreover, the ion-implanter of the present invention can change the projecting angle of the ion beam so as to implant a small amount of ions beneath the lower edge on each side of the gate electrode 12 by optionally changing the projecting angle of the ion beam, and then immediately regulate the angle at 90 degrees for implanting a large amount of ions.

Thus, the number of the processes may be reduced and intermediate processes for forming a spacer such as a spacer deposition, a masking and an etching of the spacer may be omitted, so that the damages usually occurring during these processes are avoided. Accordingly, the present invention reduces the materials needed and improve the electrical properties of the device.

It will be apparent to those skilled in the art that various modifications and variations can be made in the ion-implanter of the present invention without departing from the spirit or scope of the invention. Thus, it is intended that the present invention cover the modifications and variations of this invention provided they come within the scope of the appended claims and their equivalents.

What is claimed is:

1. An ion-implanter having variable ion-beam angle control, comprising:

an ion source for decomposing a gas introduced from an external gas box into a plasma gas;

a magnetic analyzer for analyzing only desired ions among all atoms of said decomposed plasma;

an accelerating tube for accelerating said analyzed ions with a selected energy;

a scanner for scanning said accelerated ions on a surface of a wafer;

a Faraday box provided between said scanner and said wafer and connected to an ammeter for measuring an amount of said ions; and a means for regulating an angle of an ion beam which passes said Faraday box, wherein said means includes:

a magnet provided at the end of said Faraday box, which is located between said Faraday box and said wafer, and applying a magnetic field to said ion beam passing through said Faraday box to change said angle of said ion beam;

a data input for entering a required normal angle of said ion beam;

a controller for setting process conditions on the basis of a signal received from said data input; and a driver for combining said signal of said controller and a voltage feedback signal of said accelerating tube so as to fix a magnitude of said magnetic field of said magnet to a level required in said process.

2. The ion-implanter as defined in claim 1, wherein said magnet is an electromagnet whose polarity is reversible.

3. The ion-implanter as defined in claim 1, wherein said magnet is a rotating electromagnet for generating a rotational magnetic field.

* * * * *

UNITED STATES PATENT AND TRADEMARK OFFICE
CERTIFICATE OF CORRECTION

PATENT NO. : 5,696,382
DATED : December 9, 1997
INVENTOR(S) : Kwon

It is certified that error appears in the above-identified patent and that said Letters Patent is hereby corrected as shown below:

Column 1, line 51 replace "$N^-$" with --$N^+$--

Signed and Sealed this

Twenty-third Day of June, 1998

Attest:

BRUCE LEHMAN

*Attesting Officer*  *Commissioner of Patents and Trademarks*